United States Patent

Nuttall et al.

[11] Patent Number: 6,165,853
[45] Date of Patent: Dec. 26, 2000

[54] TRENCH ISOLATION METHOD

[75] Inventors: Michael Nuttall, Meridian; Kevin J. Torek; David L. Chapek, both of Boise, all of Id.

[73] Assignee: Micron Technology, Inc., Boise, Id.

[21] Appl. No.: 08/977,854

[22] Filed: Nov. 25, 1997

Related U.S. Application Data

[63] Continuation-in-part of application No. 08/877,527, Jun. 16, 1997.

[51] Int. Cl.$^7$ .................................................. H01L 21/762
[52] U.S. Cl. .......................... 438/296; 438/424; 438/738; 438/743
[58] Field of Search ...................................... 438/424, 296, 438/FOR 227, 738, 743, FOR 131, FOR 398; 148/DIG. 85, DIG. 86, DIG. 50

[56] References Cited

U.S. PATENT DOCUMENTS

| | | |
|---|---|---|
| 4,127,437 | 11/1978 | Bersin et al. . |
| 4,749,440 | 6/1988 | Blackwood et al. . |
| 5,022,961 | 6/1991 | Izumi et al. . |
| 5,234,540 | 8/1993 | Grant et al. . |
| 5,316,965 | 5/1994 | Philipossian et al. . |
| 5,376,233 | 12/1994 | Man . |
| 5,438,012 | 8/1995 | Kamiyama . |
| 5,571,375 | 11/1996 | Izumi et al. . |
| 5,677,229 | 10/1997 | Morita et al. . |
| 5,721,173 | 2/1998 | Yano et al. . |
| 5,728,621 | 3/1998 | Zheng et al. . |
| 5,731,241 | 3/1998 | Jang et al. . |
| 5,763,315 | 6/1998 | Benedict et al. . |
| 5,783,495 | 7/1998 | Li et al. . |
| 5,795,811 | 8/1998 | Kim et al. . |
| 5,858,858 | 1/1999 | Park et al. . |

OTHER PUBLICATIONS

Jensen et al., *BPSG to Thermal Oxide Etch Selectivity for Contact Clean Applications,* Technical Report DC/DE, Jan. 29, 1991, 9 pages.

Chen, C., et al., "A Novel 0.25 μm Shallow Trench Isolation Technology", United Microelectronics Corp., Advanced Technology Development Dept., Taiwan, R.O.C.; 4 pages (undated).

Wolf, S., et al., "Silicon Processing for the VLSI Era: vol. 1, Process Technology", Lattice Press, pp. 533, 534, 555 1986.

*Primary Examiner*—George Fourson
*Attorney, Agent, or Firm*—Wells, St. John, Roberts, Gregory & Matkin P.S.

[57] ABSTRACT

A method of forming trench isolated integrated circuitry on a substrate provides a substrate having a first insulating material within and projecting from an isolation trench and a second insulating material laterally proximate the first insulating material. The second insulating material is etched substantially selective relative to the first insulating material to expose substrate beneath the second insulating material. After the etching, a gate dielectric layer is formed over the exposed substrate. A transistor gate is formed over the gate dielectric layer. In but one other implementation, an oxide layer is thermally grown over a semiconductive substrate. An isolation trench is formed through the thermal oxide layer and the semiconductive substrate. Oxide is deposited within the trenches and formed to project outwardly relative to the thermal oxide. The thermally grown oxide is etched substantially selective relative to the deposited oxide to outwardly expose the semiconductive substrate and provide deposited oxide within the isolation trench which projects outwardly of the substrate. The semiconductive substrate and projecting deposited oxide have an interface therebetween which is substantially void of any recess of the deposited oxide below the semiconductive substrate. After the etching, gate oxide is grown over the substrate and the interface. A transistor gate is formed over the gate oxide over the semiconductive substrate.

31 Claims, 3 Drawing Sheets

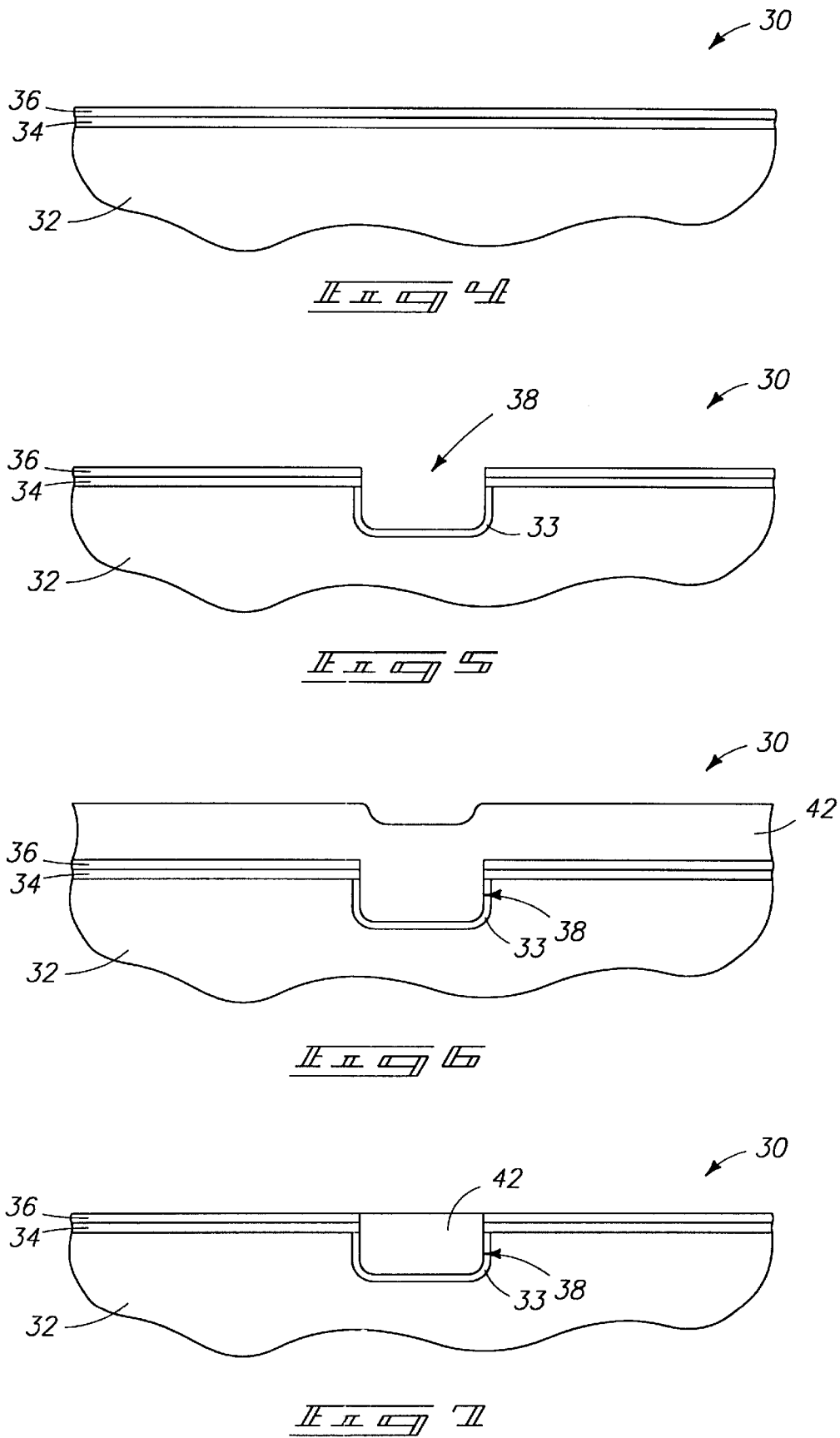

TRENCH ISOLATION METHOD

RELATED PATENT DATA

This patent resulted from a continuation-in-part application of U.S. patent application Ser. No. 08/877,527, filed on Jun. 16, 1997 entitled "Method Of Etching Thermally Grown Oxide Substantially Selectively Relative To Deposited Oxide", listing Kevin J. Torek as inventor.

TECHNICAL FIELD

This invention relates to trench isolation methods.

BACKGROUND OF THE INVENTION

Integrated circuitry is typically fabricated on and within semiconductor substrates, such a bulk monocrystalline silicon wafers. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrical components fabricated on substrates, and particularly bulk semiconductor wafers, are isolated from adjacent devices by insulating materials, such as insulating oxides. One isolation technique uses trench isolation, whereby trenches are cut into a substrate and are subsequently filled with insulating material, such as undoped silicon dioxide deposited by plasma-enhanced decomposition of tetraethylorthosilicate (PETEOS). The insulating material is typically planarized back to define isolated trenches filled with oxide. A subclass of trench isolation is "shallow trench isolation". In the context of this document, "shallow" shall refer to a distance no greater than about 1 micron from the outermost surface of the substrate material within which the isolation material is received. Also in the context of this document, "substantially undoped" means a layer having a dopant concentration which is less than or equal to $10^{18}$ atoms/cm$^3$.

An example prior art construction and its associated problems is described with reference to FIGS. 1–3. A wafer fragment 10 includes a bulk silicon substrate 12 having a protective pad oxide layer 14 formed thereover. A trench 16 is cut through oxide layer 16 and into substrate 12. A thermal oxide layer 17 lines trench 16. Such is filled with a deposited oxide material 18, such as oxide formed by PETEOS. Such has been planarized back, and a deposited nitride layer (not shown) selectively stripped relative to deposited oxide 18 and thermally grown oxide 14 to produce the deposited oxide projecting outwardly relative to both substrate 12 and thermal oxide layer 14.

Thermal oxide layer 14 is typically inadequate to function as a gate dielectric layer, and is accordingly removed from the wafer as shown in FIG. 2. FIG. 2 illustrates an oxide etch of layers 18 and 14 effective to outwardly expose substrate 12. An example for such etching is wet etching with HF. To assure complete etching of the oxide layer 14, a degree of over-etch is conducted. Unfortunately, this has the undesired effect of producing recesses or keyholes 20 at interfaces where semiconductive substrate 12 joins with deposited oxide 18. The typical faster etch rate of deposited oxide relative to grown oxide only exacerbates this problem.

Referring to FIG. 3, a gate dielectric layer 22 is thereafter formed (i.e., thermally grown or deposited oxide), followed by deposition and patterning of a conductive layer 24 (i.e., polysilicon capped with WSi$_x$) to form a desired field effect transistor gate. Unfortunately, this abrupt oxide step or recess 20 apparently results in a parallel low threshold-voltage (V$_t$) device along the transistor width. The V$_t$ of this edge device also depends on geometric factors, such as the gate wrap-around, corner radius, and sidewall corner angle. Yet, this abrupt oxide step or recess is believed to cause sub-threshold "kink" which adversely affects device reliability and operation.

SUMMARY OF INVENTION

In but one implementation, a method of forming trench isolated integrated circuitry on a substrate starts with providing a substrate having a first insulating material within and projecting from an isolation trench and a second insulating material laterally proximate the first insulating material. The second insulating material is etched substantially selective relative to the first insulating material to expose substrate beneath the second insulating material. After the etching, a gate dielectric layer is formed over the exposed substrate. A transistor gate is formed over the gate dielectric layer. In but one other implementation, an oxide layer is thermally grown over a semiconductive substrate. An isolation trench is formed through the thermal oxide layer and the semiconductive substrate. Oxide is deposited within the trenches and formed to project outwardly relative to the thermal oxide. The thermally grown oxide is etched substantially selective relative to the deposited oxide to outwardly expose the semiconductive substrate and provide deposited oxide within the isolation trench which projects outwardly of the substrate. The semiconductive substrate and projecting deposited oxide have an interface therebetween which is substantially void of any recess of the deposited oxide below the semiconductive substrate. After the etching, gate oxide is grown over the substrate and the interface. A transistor gate is formed over the gate oxide over the semiconductive substrate.

BRIEF DESCRIPTION OF THE DRAWINGS

Preferred embodiments of the invention are described below with reference to the following accompanying drawings.

FIG. 4 is a sectional view of a semiconductor wafer fragment at one processing step in accordance with the invention.

FIG. 5 is a view of the FIG. 4 wafer at a processing step subsequent to that shown by FIG. 4.

FIG. 6 is a view of the FIG. 4 wafer at a processing step subsequent to that shown by FIG. 5.

FIG. 7 is a view of the FIG. 4 wafer at a processing step subsequent to that shown by FIG. 6.

DETAILED DESCRIPTION OF THE PREFERRED EMBODIMENTS

Figure 1:
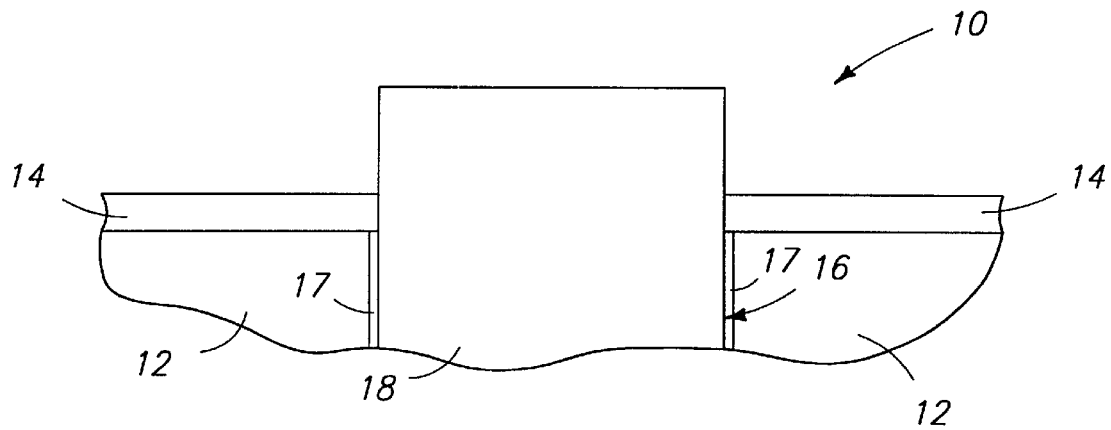
FIG. 1 is a sectional view of a prior art semiconductor wafer fragment at a prior art processing step.

This disclosure of the invention is submitted in furtherance of the constitutional purposes of the U.S. Patent Laws "to promote the progress of science and useful arts" (Article 1, Section 8).

Referring to FIG. 4, a semiconductor wafer fragment 30 is comprised of a bulk monocrystalline silicon substrate 32. An oxide layer 34, such as silicon dioxide, is formed over bulk silicon wafer 32 to form a pad/protection oxide layer. Such could be formed by any technique, such as thermally oxidizing the outer silicon surface of substrate 32 in a steam ambient at 800° C.–1150° C. for from 1–120 minutes to form a substantially undoped silicon dioxide layer 34 to a thickness of from 40–200 Angstroms. A silicon nitride layer 36 is formed over thermal silicon dioxide layer 34, for example by chemical vapor deposition. Such will principally serve as an etch or polishing stop layer as will be apparent subsequently.

Referring to FIG. 5, a series of circuitry isolation trenches are formed through silicon nitride layer 36, thermal silicon dioxide layer 34 and within bulk silicon wafer 32, with one such trench 38 being illustrated. An oxide passivation layer 33 can be grown, for example to a thickness of from about 50 Angstroms to about 300 Angstroms.

Referring to FIG. 6, a deposited oxide material 42 is formed over wafer 30 to fill circuitry isolation trench 38. Layer 42 preferably comprises a substantially undoped silicon dioxide provided by plasma enhanced chemical vapor deposition from decomposition of tetraethylorthosilicate. Thus, ideally both material 42 and layer 34 are substantially undoped. Further in this embodiment, the thermally grown oxide 34 is provided before the deposited oxide, with thermally grown oxide 34 also being provided before formation of the circuitry isolation trenches.

Referring to FIG. 7, deposited silicon dioxide layer 42 is planarized polished, such as by chemical-mechanical polishing, in a manner which is substantially selective relative to silicon nitride layer 36, with layer 36 such thus forming an etch stop layer. This provides but one example of removing deposited oxide from outwardly of trench 38, and providing a thermally grown oxide layer over the substrate outwardly of the trench.

Figure 8:
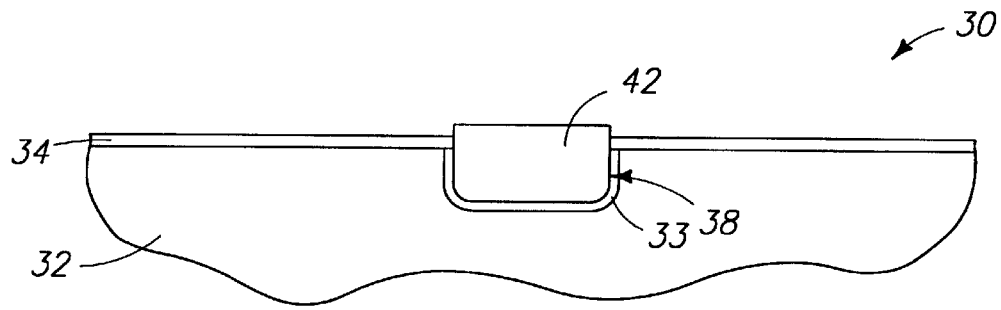
FIG. 8 is a view of the FIG. 4 wafer at a processing step subsequent to that shown by FIG. 7.

Referring to FIG. 8, silicon nitride layer 36 is etched substantially selective relative to thermal silicon dioxide layer 34 and deposited silicon dioxide layer 42, leaving outwardly exposed substantially undoped deposited silicon dioxide and outwardly exposed thermal silicon dioxide. An example chemistry would include a wet $H_3PO_4$ etch.

Figure 9:
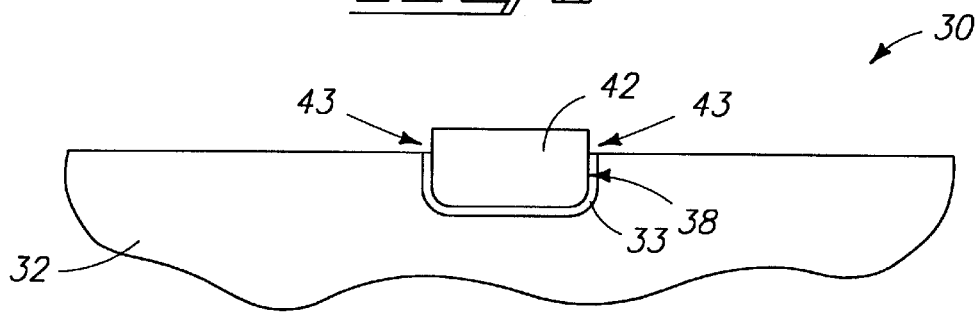
FIG. 9 is a view of the FIG. 4 wafer at a processing step subsequent to that shown by FIG. 8.

Referring to FIG. 9, the exposed thermally grown oxide material 34 is etched substantially selective relative to the exposed deposited oxide 42. Thus in this embodiment, the deposited oxide material is outwardly exposed at commencing of the etching of the grown oxide material substantially selective relative to the deposited oxide material. Such etching ideally outwardly exposes the silicon substrate, and provides substantially undoped deposited silicon dioxide within the isolation trench which projects outwardly or the substrate. Such also provides an interface 43, where substrate material 32 meets deposited silicon dioxide material 42, which is substantially void of any recess of the deposited oxide below the silicon substrate.

The preferred etching is vapor etching, which also etches the thermal oxide substantially selective relative to underlying silicon, using an etch chemistry comprising substantially anhydrous HF and an organic primer. In the context of this document, "substantially anhydrous" means having no greater than 10% water by volume of the HF fraction of the etching chemistry. Most preferably, the substantially anhydrous HF fraction has less than or equal to 0.1% water by volume. Preferred organic primers include alcohols and ketones and mixtures thereof, with methanol being but one example. A preferred temperature and pressure range during the vapor etching is from about 50° C. to about 150° C. and a pressure from about 10 Torr to about 300 Torr.

One reduction-to-practice example included anhydrous HF having less than 0.1% water at a flow rate of 180 sccm, and $N_2$ flow rate of 750 sccm, and $CH_3OH$ at 175 sccm. The temperature was 120° C. and pressure was 100 Torr. Selectivity in etch rate of the thermally grown silicon dioxide to the chemical vapor deposited silicon dioxide by PETEOS was approximately 171:1.

The above described preferred embodiment facilitates preservation of deposited oxide thickness and minimizing or avoiding keyhole/recess formation in trench isolation when stripping thermal oxide from the active device regions. Ultraviolet light is preferably not used in the process.

Figure 10:
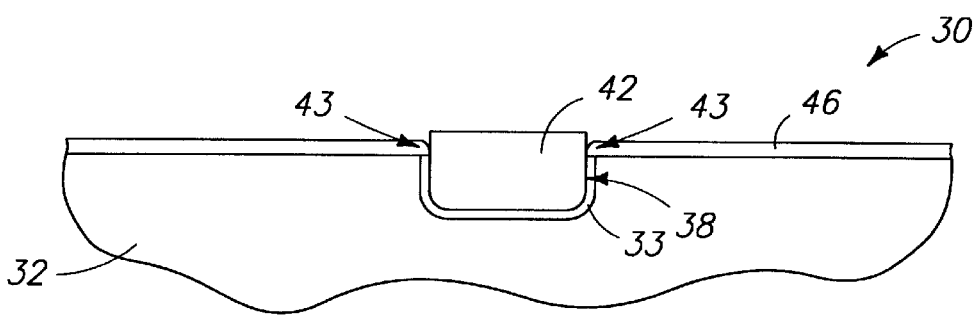
FIG. 10 is a view of the FIG. 4 wafer at a processing step subsequent to that shown by FIG. 9.

Referring to FIG. 10, a gate oxide layer 46 is grown over silicon substrate 12 and interface 43.

Figure 11:
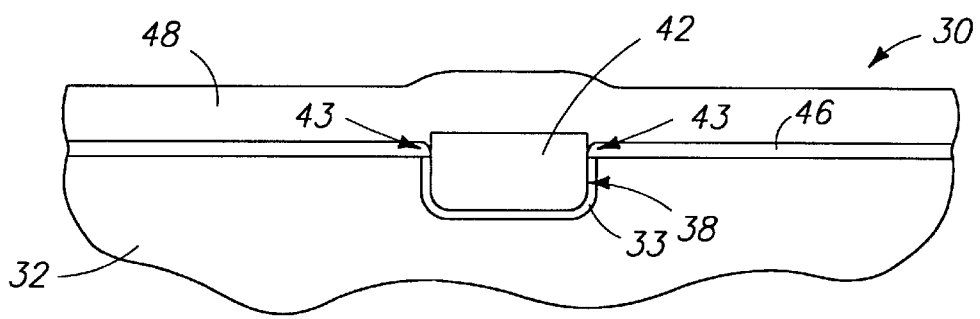
FIG. 11 is a view of the FIG. 4 wafer at a processing step subsequent to that shown by FIG. 10.

Referring to FIG. 11, a transistor gate layer 48 is provided and patterned over gate oxide layer 46.

Figure 2:
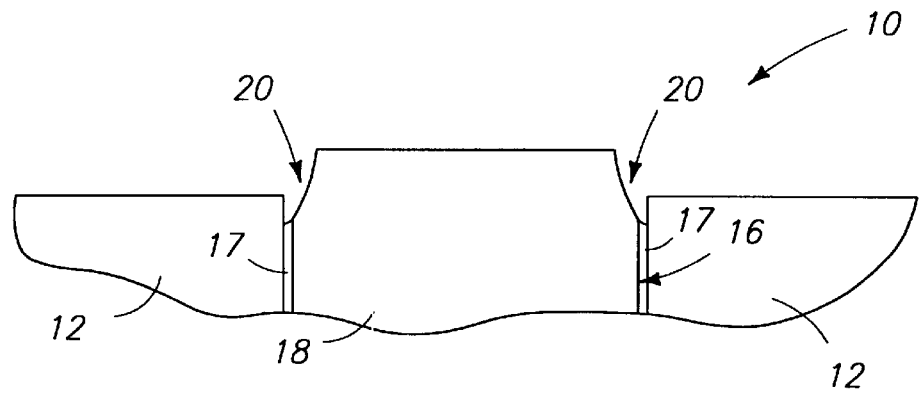
FIG. 2 is a view of the FIG. 1 wafer at a prior art processing step subsequent to that shown by FIG. 1.
Figure 3:
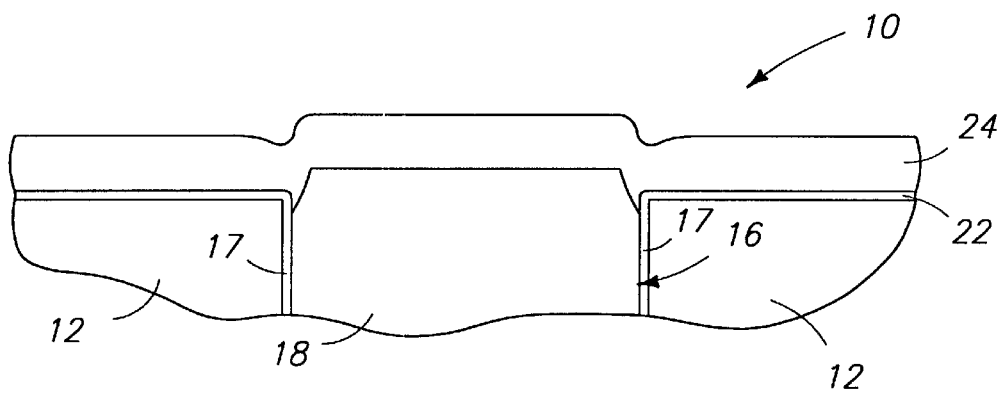
FIG. 3 is a view of the FIG. 1 wafer at a prior art processing step subsequent to that shown by FIG. 2.

Such processing essentially eliminates the prior art recess formed in FIG. 2 such that a smoother transition in the gate oxide layer and overlying transistor gate at interface 43 between the substrate and deposited oxide layer occurs. Thus, the kink effect in the IV characteristics of the device can be substantially reduced, if not eliminated.

The invention resulted from concerns or issues primarily associated with shallow trench isolation involving thermally grown pad oxide layers and deposited oxide layers, and selective etching issues pertaining thereto. The invention is believed to have its greatest applicability with respect to such fabrication and overcoming problems specifically pertaining thereto. However, the artisan will appreciate applicability of the invention in other areas, with the invention only being limited by the accompanying claims appropriately interpreted in accordance with the Doctrine of Equivalents. For example, insulating material other than deposited oxide might be utilized for filling the subject isolation trenches, and the selective etch of an oxide or other material provided laterally proximate thereto etched substantially selective relative to the insulating material provided within the trench. By way of example only, $Si_3N_4$ is one possible alternate material for filling the isolation trench. Other oxide or non-oxide materials could alternately constitute layer 34.

What is claimed is:

1. A method of forming trench isolated integrated circuitry on a substrate comprising:

providing a substrate having a first insulating material within and projecting from an isolation trench and a thermally grown oxide laterally proximate the first insulating material;

etching the thermally grown oxide substantially selective relative to the first insulating material using a substantially anhydrous HF gas chemistry to expose substrate therebeneath;

after the etching, forming a gate dielectric layer over the exposed substrate; and forming a transistor gate over the gate dielectric layer.

2. The method of claim 1 wherein the first insulating material predominately comprises oxide.

3. The method of claim 2 wherein the oxide of the first insulating material is substantially undoped.

4. The method of claim 1 wherein the first insulating material does not predominately comprise oxide.

5. The method of claim 1 wherein the first insulating material predominately comprises a nitride.

6. The method of claim 1 wherein etching chemistry during etching comprises vapor HF, and the etching is conducted at a temperature ranging from about 60° C. to about 150° C.

7. The method of claim 1 wherein etching chemistry during etching comprises vapor HF, and the etching is conducted at a pressure ranging from about 10 Torr to about 300 Torr.

8. The method of claim 1 wherein etching chemistry during etching comprises vapor HF, and the etching is conducted at a temperature ranging from about 60° C. to about 150° C. and at a pressure ranging from about 10 Torr to about 300 Torr.

9. The method of claim 1 wherein etching chemistry during etching comprises vaporized substantially anhydrous HF.

10. The method of claim 9 wherein the anhydrous HF has less than or equal to 0.1% water by volume.

11. The method of claim 1 wherein etching chemistry during etching comprises vaporized substantially anhydrous HF and an organic primer.

12. The method of claim 1 comprising providing the isolation trench to be no deeper than about 1 micron into said substrate.

13. A method of forming trench isolated integrated circuitry on a semiconductive substrate comprising:

thermally growing an oxide layer over a semiconductive substrate;

forming an isolation trench through the thermal oxide layer and the semiconductive substrate;

forming deposited oxide within the trenches which projects outwardly relative to the thermal oxide;

etching the thermally grown oxide substantially selective relative to the deposited oxide using a substantially anhydrous gas chemistry to outwardly expose the semiconductive substrate and provide deposited oxide within the isolation trench which projects outwardly of the substrate, the semiconductive substrate and projecting deposited oxide having an interface therebetween which is substantially void of any recess of the deposited oxide below the semiconductive substrate;

after the etching, growing gate oxide over the substrate and the interface; and forming a transistor gate over the gate oxide over the semiconductive substrate.

14. The method of claim 13 wherein etching chemistry during etching comprises vapor HF.

15. The method of claim 13 wherein etching chemistry during etching comprises vaporized substantially anhydrous HF.

16. The method of claim 15 wherein the anhydrous HF has less than or equal to 0.1% water by volume.

17. The method of claim 13 wherein etching chemistry during etching comprises vaporized substantially anhydrous HF and an organic primer.

18. The method of claim 13 comprising providing the deposited oxide by plasma enhanced decomposition of tetraethylorthosilicate to form silicon dioxide.

19. The method of claim 13 wherein the grown oxide is substantially undoped.

20. The method of claim 13 wherein the deposited oxide is substantially undoped.

21. The method of claim 13 wherein both of the grown and deposited oxides are substantially undoped.

22. The method of claim 13 comprising providing the isolation trench to be no deeper than about 1 micron into said substrate.

23. A method of forming trench isolated integrated circuitry on a silicon wafer comprising:

thermally growing a silicon dioxide layer over a bulk silicon wafer;

forming a silicon nitride layer over the thermal silicon dioxide layer;

forming a series of circuitry isolation trenches through the silicon nitride and thermal silicon dioxide and within the bulk silicon wafer;

chemical vapor depositing an electrically insulative substantially undoped silicon dioxide over the silicon wafer and within the trenches from decomposition of tetraethylorthosilicate;

planarize polishing the deposited substantially undoped silicon dioxide substantially selective relative to the silicon nitride layer;

etching the silicon nitride layer substantially selective relative to the thermal silicon dioxide and the deposited silicon dioxide leaving outwardly exposed substantially undoped deposited silicon dioxide and outwardly exposed thermal silicon dioxide;

vapor etching the exposed thermal silicon dioxide substantially selective relative to both the exposed deposited substantially undoped silicon dioxide and silicon using an etch chemistry comprising substantially anhydrous HF and an organic primer at a temperature of greater than or equal to about 50 degrees C. and at subatmospheric pressure to outwardly expose the silicon substrate and provide substantially undoped deposited silicon dioxide within the isolation trench which projects outwardly of the silicon substrate, the silicon substrate and projecting deposited silicon dioxide having an interface therebetween which is substantially void of any recess of the deposited oxide below the silicon substrate; and after the vapor etching, growing gate oxide over the silicon wafer and the interface; and forming a transistor gate over the gate oxide over the silicon wafer.

24. The method of claim 23 wherein the chemical vapor depositing comprises plasma enhanced decomposition of tetraethylorthosilicate.

25. The method of claim 23 wherein the substantially anhydrous HF has less than or equal to 0.1% water by volume.

26. The method of claim 23 wherein the organic primer is selected from the group consisting of alcohols and ketones and mixtures thereof.

27. The method of claim 23 wherein the vapor etching is conducted at a pressure ranging from about 10 Torr to about 300 Torr.

28. The method of claim 23 wherein the thermal silicon dioxide is substantially undoped.

29. The method of claim 23 wherein the deposited silicon dioxide is substantially undoped.

30. The method of claim 23 wherein both the thermal silicon dioxide and the deposited silicon dioxide are substantially undoped.

31. The method of claim 23 comprising providing the isolation trench to be no deeper than about 1 micron into said substrate.

* * * * *